United States Patent

Smuda et al.

(10) Patent No.: US 9,051,888 B2
(45) Date of Patent: Jun. 9, 2015

(54) METHOD FOR AUTOMATICALLY CONTROLLING A STATIONARY GAS ENGINE

(75) Inventors: Peer Smuda, Sindelfingen (DE); Michael Prothmann, Friedrichshafen (DE); Ludwig Klaser-Jenewein, Frickingen (DE)

(73) Assignee: MTU FRIEDRICHSHAFEN GMBH, Friedrichshafen (DE)

( * ) Notice: Subject to any disclaimer, the term of this patent is extended or adjusted under 35 U.S.C. 154(b) by 710 days.

(21) Appl. No.: 12/363,042

(22) Filed: Jan. 30, 2009

(65) Prior Publication Data

US 2009/0192698 A1 Jul. 30, 2009

(30) Foreign Application Priority Data

Jan. 30, 2008 (DE) .................. 10 2008 006 708

(51) Int. Cl.
| | |
|---|---|
| F02D 41/00 | (2006.01) |
| F02D 29/06 | (2006.01) |
| F02D 19/02 | (2006.01) |
| F02B 29/04 | (2006.01) |
| F02B 43/00 | (2006.01) |
| F02B 63/04 | (2006.01) |

(Continued)

(52) U.S. Cl.
CPC ......... F02D 41/0027 (2013.01); F02B 29/0406 (2013.01); F02B 43/00 (2013.01); F02B 63/04 (2013.01); F02D 29/06 (2013.01); F02M 21/0239 (2013.01); F02M 21/04 (2013.01); F02D 19/023 (2013.01); F02D 19/025 (2013.01); Y02T 10/32 (2013.01)

(58) Field of Classification Search
CPC .......... F02D 41/00; F02D 19/00; F02D 21/00
USPC ..................... 701/70, 75, 84–87, 90, 99–104; 123/344, 349–350, 402–403
See application file for complete search history.

(56) References Cited

U.S. PATENT DOCUMENTS 5,009,210 A * 4/1991 Nakagawa et al. ........... 123/682
5,365,903 A * 11/1994 Watanabe ................ 123/339.22

(Continued)

FOREIGN PATENT DOCUMENTS

| DE | 19654699 | 7/1997 |
|---|---|---|
| DE | 10213341 | 10/2003 |

(Continued)

OTHER PUBLICATIONS

A. Hanenkamp, et al. "Otto-Gasmotor ohne Zünderzen" 1967, pp. 932-941.

(Continued)

*Primary Examiner* — John Q Nguyen
*Assistant Examiner* — Michael Ng
(74) *Attorney, Agent, or Firm* — Lucas & Mercanti, LLP; Klaus P. Stoffel

(57) ABSTRACT

A method for automatically controlling a stationary gas engine, where an engine speed control deviation is computed from a set engine speed (nSL) and an actual engine speed (nIST), and a set torque is determined as a correcting variable from the speed control deviation by a speed controller, where a set volume flow is determined as a function of the set torque to establish a mixture throttle angle (DKW1, DKW2) and a gas throttle angle, and where the set volume flow is varied to adjust the gas throttle angle by a correction factor.

4 Claims, 4 Drawing Sheets

(51) Int. Cl.
*F02M 21/02* (2006.01)
*F02M 21/04* (2006.01)

(56) References Cited

U.S. PATENT DOCUMENTS

| | | | | |
|---|---|---|---|---|
| 5,638,677 | A * | 6/1997 | Hosono et al. | 60/431 |
| 5,931,138 | A * | 8/1999 | Uchida | 123/436 |
| 6,055,476 | A * | 4/2000 | Yoshino | 701/110 |
| 6,343,586 | B1 * | 2/2002 | Muto et al. | 123/406.25 |
| 6,978,764 | B1 * | 12/2005 | Russell et al. | 123/442 |
| 7,082,924 | B1 * | 8/2006 | Ruedin | 123/352 |
| 7,463,970 | B2 * | 12/2008 | Livshiz et al. | 701/114 |
| 2004/0089061 | A1 * | 5/2004 | Matsunaga et al. | 73/118.1 |
| 2009/0120699 | A1 * | 5/2009 | Suzuki et al. | 180/65.265 |
| 2010/0242937 | A1 * | 9/2010 | Baldauf et al. | 123/704 |
| 2010/0256890 | A1 * | 10/2010 | Baldauf et al. | 701/102 |

FOREIGN PATENT DOCUMENTS

| | | |
|---|---|---|
| DE | 10346983 | 5/2005 |
| DE | 102007045195 | 3/2009 |
| EP | 1158149 | 11/2001 |
| JP | 61014459 | 1/1986 |

OTHER PUBLICATIONS

Hanenkamp A. et al.: 32/ 40 PG1—Neuer Otto Gasmotor ohne Zündkerzen, MTZ Dec. 2006, S932-941.

* cited by examiner

METHOD FOR AUTOMATICALLY CONTROLLING A STATIONARY GAS ENGINE

BACKGROUND OF THE INVENTION

The invention relates to a method for automatically controlling a stationary gas engine, where an engine speed control deviation is computed from a set engine speed and an actual engine speed, and a set torque is determined as a correcting variable from the speed control deviation by means of a speed controller. In addition, a set volume flow is determined as a function of the set torque to establish a mixture throttle angle and a gas throttle angle, and the set volume flow is varied to adjust the gas throttle angle by a correction factor.

Stationary gas engines are used to generate electric power. The gas engine is operated at a constant lambda value of, for example, 1.7, i.e., a lean mixture with excess air. The gas engine typically includes a gas throttle for setting the gas fraction in the gas-air mixture, a mixer for mixing the combustible gas and the air, a compressor as part of an exhaust gas turbocharger, a cooler, and at least one mixture throttle. The intake volume flow in the receiver tube before the intake valves of the gas engine is set by the mixture throttle, and thus the mixture pressure in the receiver tube is also set.

EP 1 158 149 A1 describes a stationary gas engine for driving a generator. The gas engine is controlled by using a characteristic curve to compute a set lambda as a reference output from the engine output. On the basis of the set lambda, an electronic engine control unit computes a gas quantity set value for adjusting the gas throttle. In a second embodiment, the set lambda value is computed from a mixture pressure control deviation. The mixture pressure control deviation is determined from the detected actual mixture pressure in the receiver tube and the set mixture pressure, which in turn is determined from the engine output by means of a characteristic curve. In a third embodiment, as a supplement to the second embodiment, the gas quantity set value is corrected to adjust the gas throttle as a function of the position of a compressor bypass valve and the speed control deviation. A common feature of all three embodiments is the adjustment of the gas throttle to a set lambda value. In practical operation, when a change in the power assignment is made, first a change is made in the position of the mixture throttle as the power control element. This has the effect that the intake mixture volume flow also changes. Since the position of the gas throttle initially remains constant, there is also no change in the gas volume flow. This results in a changed actual lambda. When a mixture throttle is controlled to move, for example, in the closing direction, this causes enrichment of the mixture, which results in a change in output of the gas engine. As a response to this change in output, the set lambda value, the gas quantity set value, and the position of the gas throttle are then changed. In this type of automatic control, the response time, for example, when the load changes, is critical, since intervention in the lambda control is sluggish due to the system itself.

DE 103 46 983 A1 also describes a gas engine and a method for automatically controlling the fuel mixture. In this method, in a first step, an actual pressure difference of the air mass flow in a venturi mixer is determined, and, in a second step, a set pressure difference of the air mass flow is determined from the measured actual output of the gas engine. In a third step, the actual pressure difference is then brought closer to the set pressure difference by changing the amount of gas supplied by changing the position of the gas throttle. In a fourth step, the actual gas engine output that develops is detected again, and the mixture throttle is adjusted in such a way that the set/actual deviation of the pressure difference of the air mass flow in the venturi mixture is reduced. This sequential order of operations is carried out iteratively until the set/actual deviation of the pressure difference is smaller than a limit. Since a change in the position of the mixture throttle produces a change in the output of the gas engine, the position of the gas throttle must be readjusted to compensate the change in output of the gas engine. Under certain circumstances, this can cause the correcting variables to overshoot.

A method for automatically controlling a stationary gas engine is disclosed by the nonprepublished German patent application with the official file number DE 10 2007 045 195.9, in which a gas throttle and a mixture throttle are simultaneously controlled as a function of the same actuating variable, in this case a set volume flow. The set volume flow is determined on the basis of a set torque, which is computed as a correcting variable by a speed controller from a set/actual deviation of the engine speeds. To improve the operating reliability, a torque limiter is provided, by which the set torque is limited at least as a function of a fault signal, for example, in the event of a sensor failure. In practice, however, it has been found that this method is still not optimal with respect to fluctuating fuel quality or fuel density.

SUMMARY OF THE INVENTION

The objective of the invention is to reduce the effect of fluctuating fuel quality or fuel density on the previously described method.

This objective is achieved by a method for automatically controlling a stationary gas engine, where an engine speed control deviation is computed from a set engine speed and an actual engine speed, and a set torque is determined as a correcting variable from the speed control deviation by means of a speed controller. In addition, the set torque is used to determine a set volume flow for determining a mixture throttle angle and a gas throttle angle, and the set volume flow is varied by a correction factor to adjust the gas throttle angle. The correction factor is computed by converting an actual system output to an actual system torque, which is then related to a limited set torque by taking the quotient. The limited set torque in turn is computed from the set torque by a torque limiter. The correction factor is then determined from the quotient by an I controller.

The quotient characterizes the deviation of the torque delivered by the gas engine (actual system output) from the internally computed limited set torque. This deviation is caused by fluctuating fuel quality or fuel density. The correction factor thus prevents the engine maps applied in the electronic engine control unit from being read out in false regions due to the deviation. The method thus has greater operating reliability and guarantees an almost constant lambda value despite a fluctuating calorific value of the gas. When an intelligent gas throttle is used, which automatically adjusts a gas throttle angle on the basis of a preassigned value, the method acts to make the correction.

To ensure that the method is robust, the correction factor is formed from the mean value of the quotients computed within a computation interval, and a distinction is made between a steady-state and a non-steady-state operating condition. In a steady-state operating condition, the computed correction factor is set as the current value for the correction of the set volume flow. In a non-steady-state operating condition, on the other hand, the last steady-state correction factor is kept as the current value for the correction of the set volume flow.

Other features and advantages of the present invention will become apparent from the following description of the invention.

DETAILED DESCRIPTION OF THE INVENTION

Figure 1:
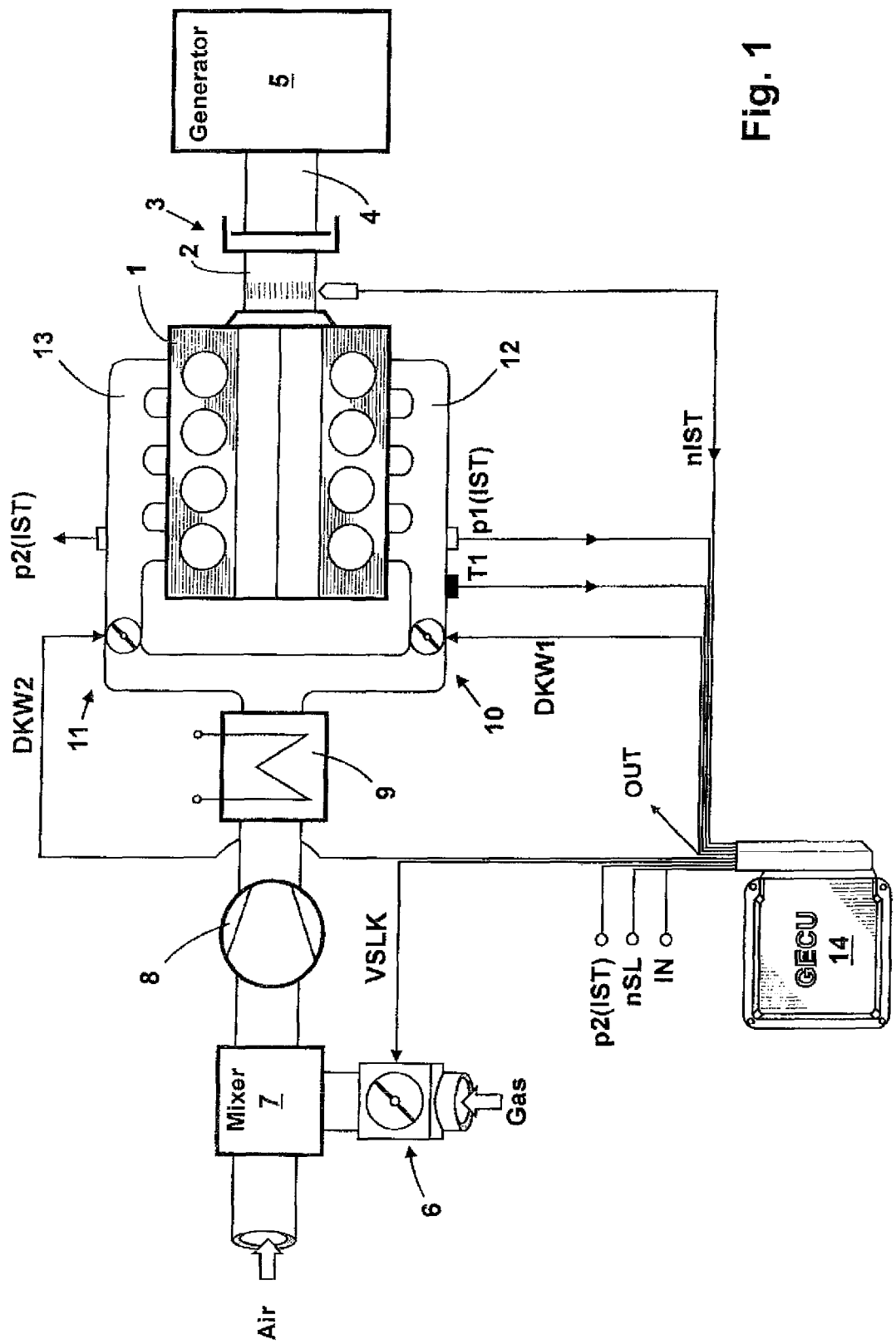
FIG. 1 is an overall schematic diagram.

FIG. 1 shows a complete diagram of a stationary gas engine 1 with a V configuration. The gas engine 1 drives a generator 5 via a shaft 2, a coupling 3, and a shaft 4. The generator 5 generates electric power, which is fed into an electric network. The following mechanical components are assigned to the gas engine 1: a gas throttle 6 for setting a supply volume flow of gas, for example, natural gas, a mixer 7 for mixing air and gas, a compressor 8 as part of an exhaust gas turbocharger, a cooler 9, a first mixture throttle 10 on the A side of the gas engine 1, and a second mixture throttle 11 on the B side of the gas engine 1.

The operating mode of the gas engine 1 is determined by an electronic engine control unit 14 (GECU). The electronic engine control unit 14 contains the customary components of a microcomputer system, for example, a microprocessor, interface adapters, buffers, and memory components (EEPROM, RAM). Operating characteristics that are relevant to the operation of the gas engine 1 are applied in the memory components in the form of engine maps/characteristic curves. The electronic engine control unit 14 uses these to compute the output variables from the input variables. FIG. 1 shows the following input variables: a first actual mixture pressure p1(IST) and a mixture temperature T1, both of which are measured in the first receiver tube 12, a second actual mixture pressure p2(IST), which is measured in the second receiver tube 13, an actual engine speed nIST of the gas engine 1, a set speed nSL, which is preassigned by a system controller (not shown) of the generator 5, and an input variable IN. The other input signals, for example, an actual system output and the oil temperature, are combined as the input variable IN. FIG. 1 also shows the following output variables of the electronic engine control unit 14: the signal of a corrected set volume flow VSLK for controlling the gas throttle 6, the signal of a first mixture throttle angle DKW1 for controlling the first mixture throttle 10, the signal of a second mixture throttle angle DKW2 for controlling the second mixture throttle 11, and a signal OUT. The signal OUT is representative of the other signals for regulating and controlling the gas engine 1.

The system has the following functionality: A gas volume flow supplied to the mixer 7 is adjusted by the position of the gas throttle 6. The position of the first mixture throttle 10 defines a first mixture volume and thus the first actual mixture pressure p1(IST) in the first receiver tube 12 upstream of the intake valves of the gas engine 1. The position of the second mixture throttle 11 defines a second mixture volume and thus the second actual mixture pressure p2(IST) in the second receiver tube 13 upstream of the intake valves of the gas engine 1.

Figure 2:
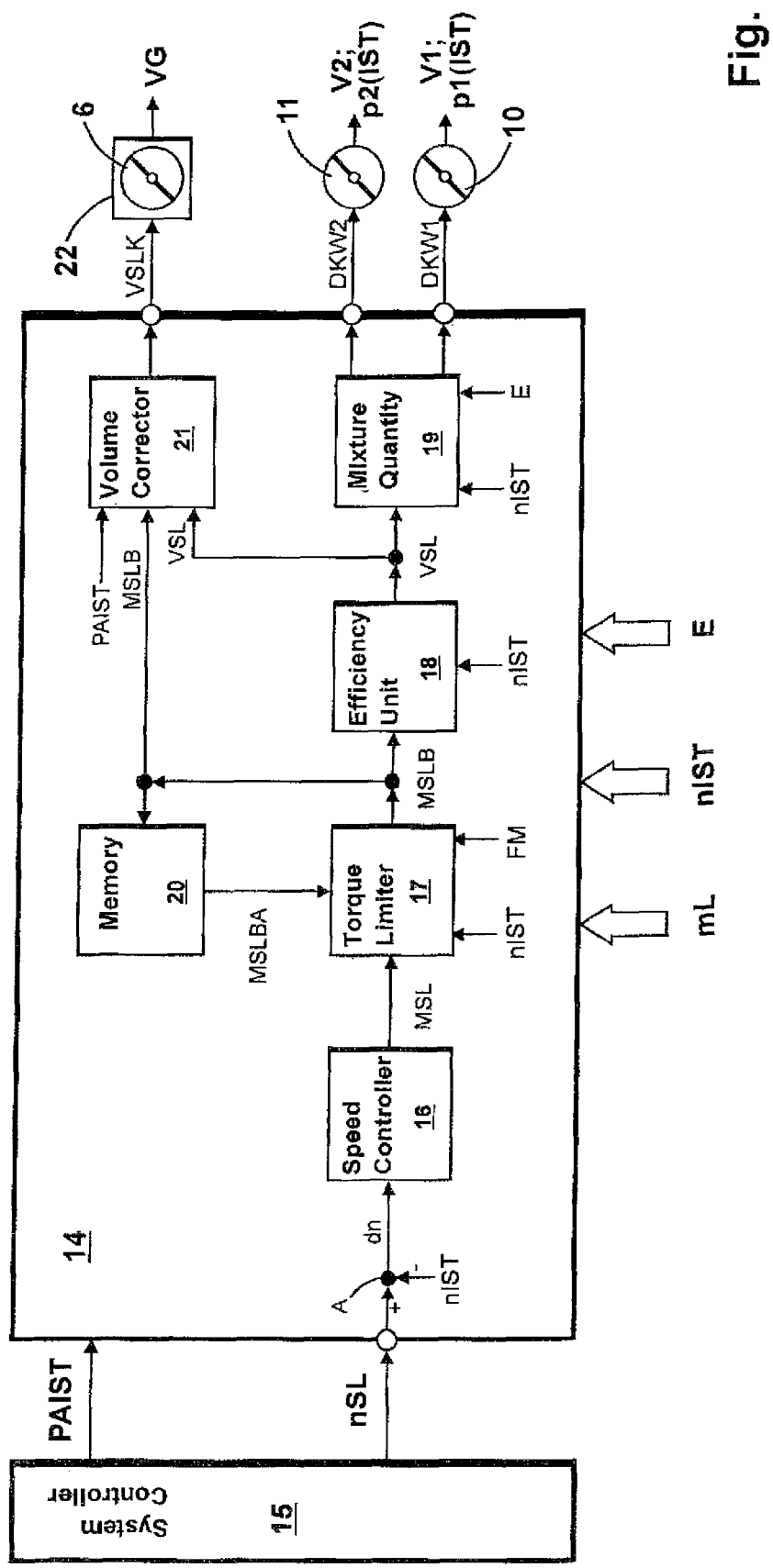
FIG. 2 is a functional block diagram for controlling the mixture throttles and the gas throttle.

FIG. 2 shows a functional block diagram for controlling the two mixture throttles 10 and 11 and the gas throttle 6. The system controller of the generator is identified by reference number 15. Reference number 14 identifies the electronic engine control unit in the form of a reduced functional block diagram, in which the depicted elements represent the program steps of an executable program. The input variables of the electronic engine control unit 14 in this representation are the set speed nSL, the actual system output PAIST, the actual speed nIST, an air mass mL, and a value E. The additional value E combines the following as constant values: a set lambda, a stroke volume of the cylinders of the gas engine, the volumetric efficiency in terms of a cylinder cutoff, and the fuel quality. The set speed nSL and the actual system output PAIST are supplied by the system controller 15. The output variables are the first mixture throttle angle DKW1 for controlling the first mixture throttle 10, the second mixture throttle angle DKW2 for controlling the second mixture throttle 11, and the corrected set volume flow VSLK for controlling the gas throttle 6. The elements shown inside the electronic engine control unit 14 are: a speed controller 16 for determining a set torque MSL as a correcting variable, a torque limiter 17, an efficiency unit 18, a mixture quantity unit 19 for converting the set volume flow VSL to the mixture throttle angle, a memory 20, and a volume correction unit 21.

The set speed nSL, for example, 1,500 rpm, which corresponds to a frequency of 50 Hz, is preset by the system controller 15 as the desired output. The actual system output PAIST is also supplied by the system controller 15. The actual system output PAIST is proportional to the actual system torque and thus to the torque delivered by the gas engine. At a point A, a speed control deviation dn is computed from the set speed nSL and the actual speed nIST. The speed controller 16 uses the speed control deviation dn to compute the set torque MSL as a correcting variable. In practice, the speed controller 16 is realized as a PIDT1 controller. The set torque MSL is one of the input variables of the torque limiter 17. The other input variables of the torque limiter 17 are the old value MSLBA of the limited set torque, the actual speed nIST, and the fault signal FM. The output variable is the limited set torque MSLB.

The torque limiter 17 limits the set torque MSL to an air ratio limit torque, a fault torque, or a mechanical maximum torque. The selection is made by a minimum value selector. The fault torque corresponds to a preassigned value, which, when a fault is detected in the signal acquisition, for example, in the event of a defective mixture temperature sensor, is indicated by the fault signal FM. The mechanical maximum torque likewise corresponds to a preassigned value, which characterizes the mechanical load upper limit of the gas engine. The air ratio limit torque is computed on the basis of the actual speed nIST and at least the old value MSLBA of the limited set torque. The old value MSLBA of the limited set torque corresponds to the value of the limited set torque MSLB that is stored in the memory 20. This value is updated on each pass through the program. However, before the old value in the memory 20 is overwritten with the new value of the limited set torque MSLB, the old value is supplied to the torque limiter 17. For example, if a new value of the limited set torque MSLB is present at time t, then the old value corresponds to the limited set torque at time t−1. If the value of the set torque MSL is within the permissible range, then the value of the limited set torque MSLB corresponds to the value of the set torque MSL. The limited set torque MSLB is the input variable of the memory 20 and the efficiency unit 18.

The efficiency unit 18 assigns the set volume flow VSL to the limited set torque MSLB as a function of the actual speed nIST. A suitable engine map is stored in the efficiency unit 18 for this purpose. The set volume flow VSL is the input variable of the mixture quantity unit 19 and at the same time the input variable of the volume correction unit 21. The first mixture throttle angle DKW1 and the second mixture throttle angle DKW2 are computed by the mixture quantity unit 19 from the set volume flow VSL as a function of the actual speed nIST and as a function of the input variable E. The mixture quantity unit 19 contains a first closed-loop control system for automatic control of the first actual mixture pressure p1(IST) and a second closed-loop control system for automatic control of the second actual mixture pressure p2(IST). The first mixture throttle 10 is controlled with the first mixture throttle angle DKW1. A first mixture volume V1 and the first actual mixture pressure p1(IST) are adjusted by the first mixture throttle 10. The second mixture throttle 11 is controlled with the second mixture throttle angle DKW2. A second mixture volume V2 and the second actual mixture pressure p2(IST) are adjusted by the second mixture throttle 11.

The set volume flow VSL is corrected by the volume correction unit 21 as a function of the limited set torque MSLB and the actual system output PAIST. The volume correction unit 21 is shown in, and will be explained in connection with, FIG. 3. The corrected set volume flow VSLK is the input variable of an intelligent gas throttle, which contains an electronic processing unit 22 and the gas throttle 6. The electronic processing unit 22 converts the value of the corrected set volume flow VSLK to a corresponding cross-sectional area and a corresponding angle. A gas volume flow VG is adjusted by the gas throttle 6 as the gas component of the gas-air mixture. The parallel control of the two mixture throttles 10 and 11 and of the gas throttle 6 as a function of the same preassigned quantity results in a short response time and a precise transient oscillation with improved adjustability of the overall system. In addition, the parallel control eliminates the need for lambda tracking.

Figure 3:
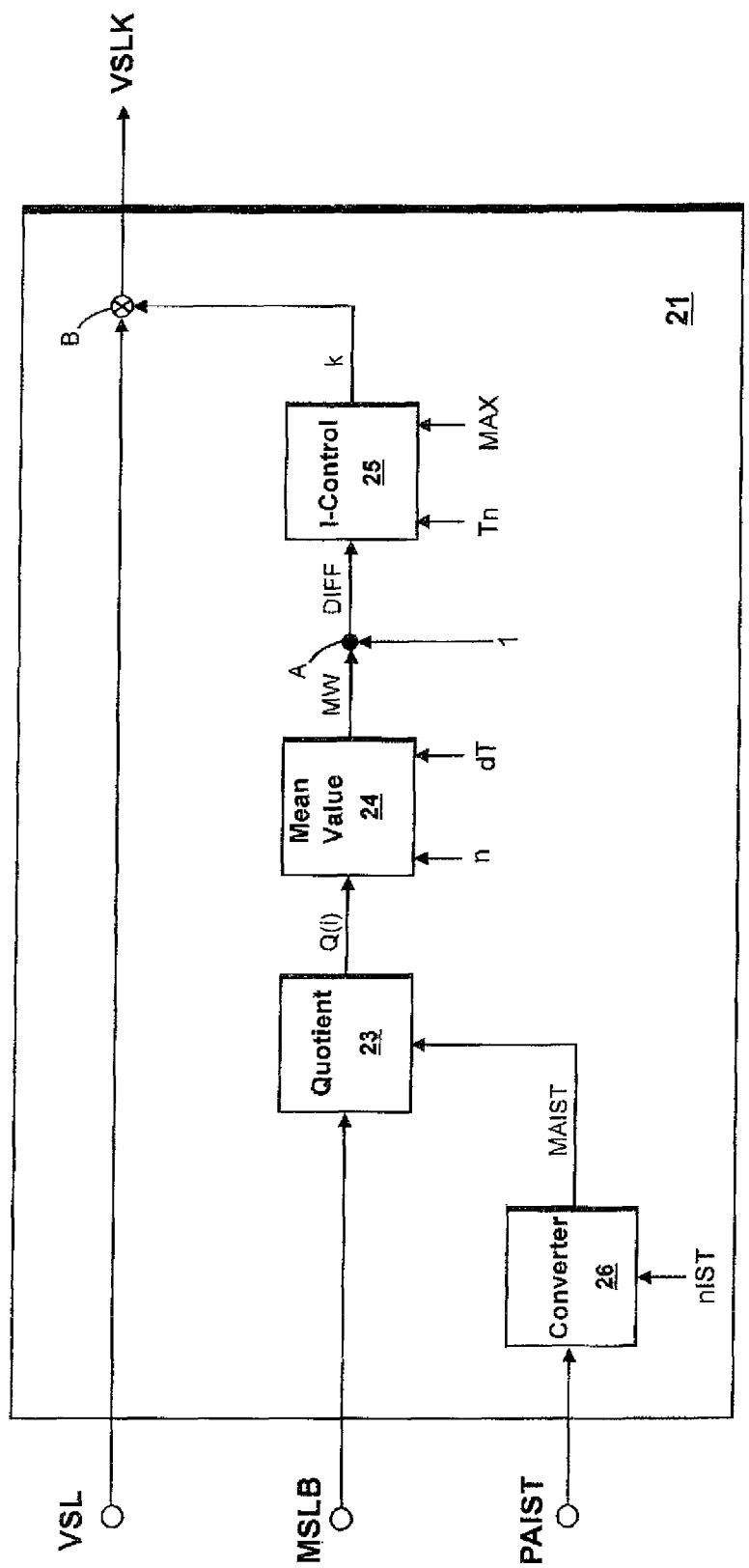
FIG. 3 is a functional block diagram of the volume correction unit.

FIG. 3 shows a functional block diagram of the volume correction unit 21. The input variables are the set volume flow VSL, the limited set torque MSLB, and the actual system output PAIST. The output variable is the corrected set volume flow VSLK, with which the gas throttle is controlled. The actual system torque MAIST is computed from the actual system output PAIST by a converter 26 by means of the actual speed nIST. The actual system torque MAIST corresponds to the torque delivered by the gas engine. The quotient Q(i), in which "i" is a running variable, is determined from the actual system torque MAIST and the limited set torque MSLB by a quotient computing unit 23. A mean value computing unit 24 determines, for example, the geometric mean of the previously computed quotient Q(i). The quotient characterizes the deviation of the torque delivered by the gas engine (actual system torque) from the internally computed limited set torque MSLB. This deviation is caused by a fluctuating fuel quality or fuel density. The input variables of the mean value computing unit 24 are the measurement frequency n and the computation interval dT. The output variable of the mean value computing unit 24 is the mean value MW. The taking of the mean value makes the method more robust. At a point A, a difference DIFF is computed by subtracting the mean value MW from the value 1. An I controller 25 then uses the difference DIFF to determine the correction factor k. For this purpose, the integral-action time Tn and a value MAX for limiting the correction factor k are supplied to the I controller 25 as input variables. At a point B, the set volume flow VSL is then multiplied by the correction factor k. The result is the corrected set volume flow VSLK. The correction factor prevents the engine maps applied in the electronic engine control unit from being read out in false regions due to the deviation of the delivered torque from the internally computed limited set torque. The method thus has greater operating reliability and guarantees an almost constant lambda value despite a fluctuating calorific value of the gas. Adjustment errors of the intelligent gas throttle, which result in a control deviation of the speed and an incorrect set torque MSL, are minimized by the correction factor k.

In the computation of the correction factor k, a distinction is made between a steady-state and a non-steady-state operating condition. In a steady-state operating condition, the computed correction factor k is set as the current value for the correction of the set volume flow. In a non-steady-state operating condition, on the other hand, the last correction factor determined during a steady-state operating condition is kept as the current value for the correction of the set volume flow.

Figure 4:
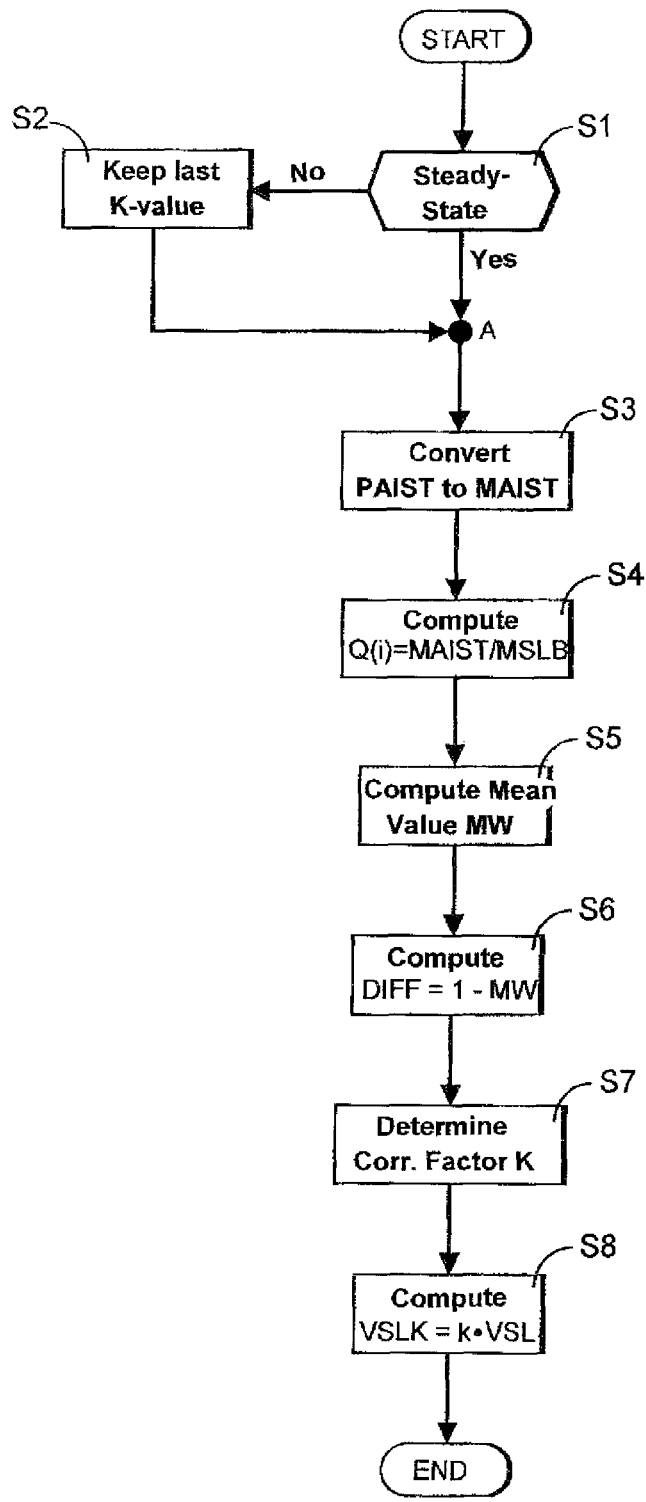
FIG. 4 is a program flowchart.

FIG. 4 shows a program flowchart of a corresponding subroutine. After the start, a check is made at S1 to determine whether a steady-state operating condition is present. If this is not the case, i.e., if the gas engine is presently being operated in a non-steady-state operating condition, for example, during a load application, then at S2 the last correction factor k determined during a steady-state operating condition is retained. Program control is then transferred to point A. If a steady-state operating condition is detected at S1 (query result at S1: yes), then at S3 the actual system output PAIST is converted to an actual system torque MAIST by means of the actual speed nIST. The actual system torque MAIST corresponds to the torque delivered by the gas engine. At S4 the quotient Q(i) of the actual system torque MAIST and the limited set torque MSLB is determined. The quotient Q(i) characterizes the deviation of the torque delivered by the gas engine (actual system torque) from the internally computed limited set torque MSLB. A deviation of this type typically manifests itself when there are fluctuations in the fuel quality or fuel density. At S5 the mean value MW of several previously computed quotients Q(i) is then computed. The boundary conditions in the mean value computation are the measurement frequency (FIG. 3: n) and the computation interval (FIG. 3: dT). At S6 the mean value MW is subtracted from the number 1. The result is the difference DIFF. At S7 the correction factor k is determined by the I controller, or, if a non-steady-state operating condition is present, the correction factor retained at S2 is used. The correction factor k is then additionally limited to a maximum value. At S8 the set volume flow VSL is multiplied by the correction factor k, and the product is supplied to the intelligent gas throttle as the corrected set volume flow VSLK. The routine is then ended.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

The invention claimed is:

1. A method for automatically controlling a stationary gaseous fueled engine, comprising the steps of:
   computing an engine speed control deviation (dn) from a set engine speed (nSL) and an actual engine speed (nIST);
   determining a set torque (MSL) as a correcting variable from the speed control deviation (dn) by a speed controller;
   determining a set volume flow (VSL) as a function of the set torque (MSL) to establish a mixture throttle angle (DKW1, DKW2) and a gaseous fuel throttle angle;
   varying the set volume flow (VSL) to adjust the gaseous fuel throttle angle by a correction factor (k); and
   computing the correction factor (k) using a volume correction unit as a function of an actual system output (PAIST) and a limited set torque (MSLB), which is computed by a torque limiter from the set torque (MSL), including converting the actual system output (PAIST) to an actual system torque (MAIST), computing a quotient (Q(i)) from the actual system torque (MAIST) and the limited set torque (MSLB), and determining the correction factor (k) from the quotient (Q(i)) using an I controller.

2. The method in accordance with claim 1, including computing a mean value (MW) from the quotients (Q(i), i=1, 2, 3, . . . ) within a computation interval, and determining the correction factor (k) with the I controller based on the mean value (MW).

3. The method in accordance with claim 2, including limiting the correction factor (k).

4. The method in accordance with claim 1, wherein, in a steady-state operating condition, the correction factor (k) is set as the current value for the correction of the set volume flow (VSL), and in a non-steady-state operating condition, the last correction factor (k) determined during a steady-state operating condition is kept as the current value for the correction of the set volume flow (VSL).

* * * * *